United States Patent
Maki

(10) Patent No.: US 9,799,811 B2
(45) Date of Patent: Oct. 24, 2017

(54) LIGHT EMITTING DEVICE

(71) Applicant: Toshiba Hokuto Electronics Corporation, Asahikawa-Shi (JP)

(72) Inventor: Keiichi Maki, Asahikawa (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 0 days.

(21) Appl. No.: 15/131,305

(22) Filed: Apr. 18, 2016

(65) Prior Publication Data

US 2016/0233399 A1 Aug. 11, 2016

Related U.S. Application Data

(63) Continuation of application No. PCT/JP2014/005323, filed on Oct. 21, 2014.

(30) Foreign Application Priority Data

Nov. 7, 2013 (JP) .................................. 2013-231164

(51) Int. Cl.
*H01L 33/56* (2010.01)
*H01L 33/54* (2010.01)
(Continued)

(52) U.S. Cl.
CPC ............... *H01L 33/62* (2013.01); *H01L 24/01* (2013.01); *H01L 25/0753* (2013.01);
(Continued)

(58) Field of Classification Search
CPC ......... H01L 24/18; H01L 33/56; H01L 33/54; H01L 33/62; H01L 27/156
See application file for complete search history.

(56) References Cited

U.S. PATENT DOCUMENTS 7,052,924 B2   5/2006  Daniels et al.
7,217,956 B2   5/2007  Daniels et al.
(Continued)

FOREIGN PATENT DOCUMENTS

JP   08-018100 A1   1/1996
JP   11-177147 A1   7/1999
(Continued)

OTHER PUBLICATIONS

International Search Report and Written Opinion (Application No. PCT/JP2014/005323) dated Jan. 20, 2015.
(Continued)

*Primary Examiner* — Jarrett Stark
*Assistant Examiner* — Charles N Ausar-El
(74) *Attorney, Agent, or Firm* — Burr & Brown, PLLC

(57) ABSTRACT

A light emitting device of an embodiment includes first and second light transmissive support bodies, and a light emitting diode is disposed between the bases. The light emitting diode includes a first semiconductor layer provided on a first surface (area $S_1$) of a substrate, a light emitting layer (area $S_2$), and a second semiconductor layer. A first electrode in a pad shape is formed on the second semiconductor layer. The light emitting diode has a shape satisfying a relation of "$1 \leq S_1/S_2 \leq -(3.46/H)+2.73$", where H is a distance from the first surface of the substrate to a surface of the first electrode.

19 Claims, 8 Drawing Sheets

(51) Int. Cl.
  *H01L 33/62*   (2010.01)
  *H01L 25/075*  (2006.01)
  *H01L 33/20*   (2010.01)
  *H01L 23/00*   (2006.01)
  *H01L 33/08*   (2010.01)
  *H01L 33/36*   (2010.01)
  *H01L 33/44*   (2010.01)
  *H01L 33/52*   (2010.01)

(52) U.S. Cl.
  CPC .............. *H01L 33/08* (2013.01); *H01L 33/20* (2013.01); *H01L 33/36* (2013.01); *H01L 33/44* (2013.01); *H01L 33/52* (2013.01); *H01L 2924/0002* (2013.01); *H01L 2933/005* (2013.01); *H01L 2933/0025* (2013.01); *H01L 2933/0066* (2013.01)

(56) References Cited

U.S. PATENT DOCUMENTS

| | | | |
|---|---|---|---|
| 7,247,985 B2* | 7/2007 | Kaneko | H01L 33/145 |
| | | | 257/79 |
| 7,259,030 B2 | 8/2007 | Daniels et al. | |
| 7,294,961 B2 | 11/2007 | Daniels et al. | |
| 7,427,782 B2 | 9/2008 | Daniels et al. | |
| 7,476,557 B2 | 1/2009 | Daniels et al. | |
| 7,677,943 B2 | 3/2010 | Daniels et al. | |
| 7,723,733 B2 | 5/2010 | Daniels et al. | |
| 7,858,994 B2 | 12/2010 | Daniels et al. | |
| 7,863,760 B2 | 1/2011 | Daniels et al. | |
| 7,952,107 B2 | 5/2011 | Daniels et al. | |
| 8,044,415 B2 | 10/2011 | Messere et al. | |
| 8,129,730 B2 | 3/2012 | Daniels | |
| 8,158,983 B2* | 4/2012 | Beeson | H01L 25/0753 |
| | | | 257/291 |
| 9,306,132 B2* | 4/2016 | Maki | H01L 25/0753 |
| 9,627,594 B2* | 4/2017 | Maki | H01L 33/56 |
| 2007/0090387 A1 | 4/2007 | Daniels et al. | |
| 2007/0194332 A1 | 8/2007 | Daniels et al. | |
| 2008/0067527 A1 | 3/2008 | Daniels et al. | |
| 2008/0191220 A1 | 8/2008 | Daniels et al. | |
| 2009/0114928 A1 | 5/2009 | Messere et al. | |
| 2009/0267102 A1* | 10/2009 | Tsai | H01L 33/56 |
| | | | 257/98 |

FOREIGN PATENT DOCUMENTS

| | | |
|---|---|---|
| JP | 2002-124489 A1 | 4/2002 |
| JP | 2007-531321 A1 | 11/2007 |
| JP | 2009-512977 A1 | 3/2009 |
| JP | 2012-084855 A1 | 4/2012 |

OTHER PUBLICATIONS

English Translation of International Preliminary Report on Patentability, International Application No. PCT/JP2014/005323, dated May 19, 2016 (7 pages).

* cited by examiner

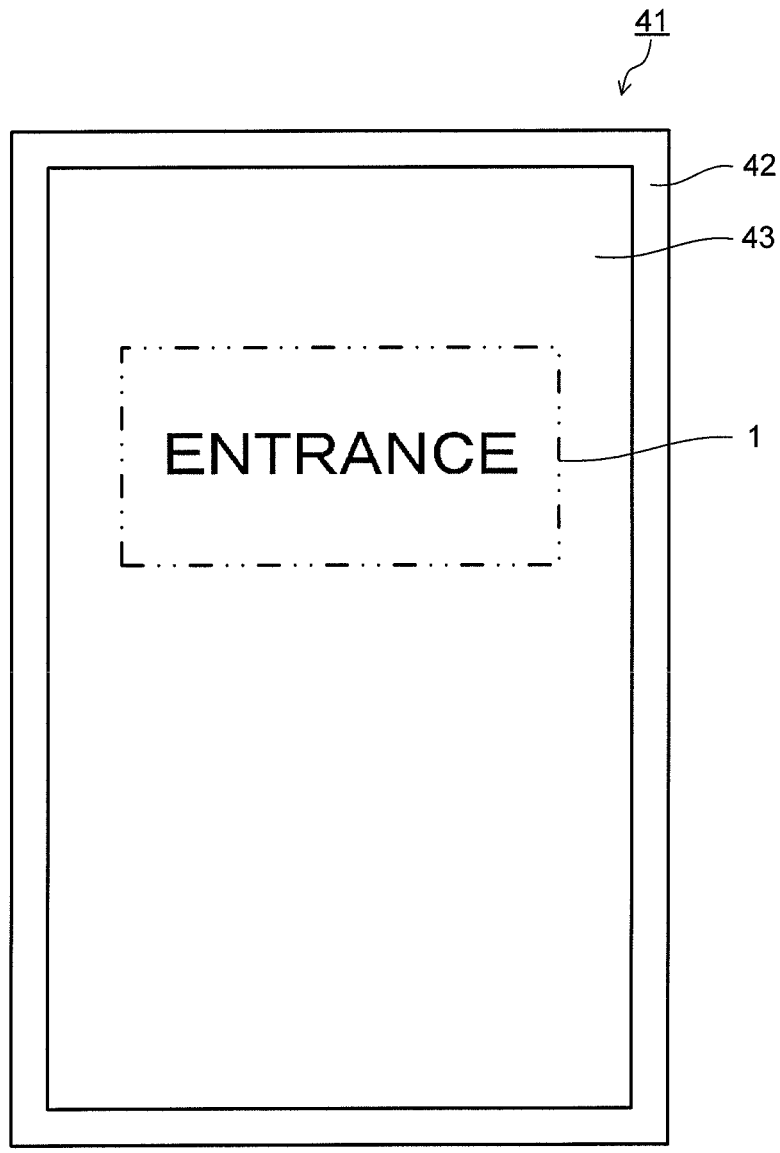

LIGHT EMITTING DEVICE

CROSS-REFERENCE TO RELATED APPLICATIONS

This application is a continuation of prior International Application No. PCT/JP2014/005323 filed on Oct. 21, 2014, which is based upon and claims the benefit of priority from Japanese Patent Application No. 2013-231164 filed on Nov. 7, 2013; the entire contents of all of which are incorporated herein by reference.

FIELD

Embodiments described herein relate generally to a light emitting device.

BACKGROUND

A light emitting device using a light emitting diode (LED) is widely used for optical devices such as display devices of indoor type, outdoor type, stationary type, movable type or the like, display lamps, various switches, signal devices, general lightings and the like. Out of light emitting devices using LEDs, there is known a transparent light emitting device in which a plurality of LEDs are disposed between two transparent substrates, as a device suitable for a display device which displays various character strings, geometric figures, patterns, or the like, a display lamp or the like. By using, as a transparent substrate, a flexible substrate or the like made of a transparent resin, restriction with respect to a surface to which the light emitting device as the display device or the display lamp is attached is reduced, which enhances convenience and availability of the transparent light emitting device.

A transparent light emitting device has a structure in which a plurality of LED chips are disposed between a first transparent insulating substrate having a first conductive circuit layer and a second transparent insulating substrate having a second conductive circuit layer, for example. The LED chip has a structure in which a first semiconductor layer, a light emitting layer, and a second semiconductor layer are stacked in order on one surface of a semiconductor substrate, for example. A first electrode is provided on the second semiconductor layer, and further, a second electrode is provided on the other surface of the semiconductor substrate. The first electrode is provided on the second semiconductor layer so that an area thereof becomes sufficiently smaller than an area of the light emitting layer in order not to prevent emission of light from the light emitting layer. The first and second electrodes of the LED chip are electrically connected to the first and second conductive circuit layers, respectively. In a space between the first transparent insulating substrate and the second transparent insulating substrate, a transparent insulating resin or the like having an electric insulation property and flexibility is filled.

Electrical connection of the electrodes of the LED chips and the conductive circuit layers, is realized when a stack of the first transparent insulating substrate, the LED chips, and the second transparent insulating substrate is subjected to thermocompression bonding, for example. Regarding the electrical connection of the electrodes of the LED chips and the conductive circuit layers, it is proposed to use a conductive adhesive or a hot melt adhesive, or to set a thickness of the transparent insulating resin filled between the substrates to be smaller than a thickness of the LED chips to press the conductive circuit layers against the electrodes of the LED chips. However, a conventional transparent light emitting device has a fault such that when it is bent, luminous intensity of LED chips easily reduces or non-lighting or the like due to short circuit easily occurs.

BRIEF DESCRIPTION OF THE DRAWINGS

FIG. 10 is a view illustrating an example of application of the light emitting device of the embodiment.

DETAILED DESCRIPTION

A light emitting device of an embodiment includes: a first light transmissive support body including a first light transmissive insulator and a first conductive circuit layer provided on a surface of the first light transmissive insulator; a second light transmissive support body including a second light transmissive insulator and a second conductive circuit layer provided on a surface of the second light transmissive insulator, the second conductive circuit layer being disposed to face the first conductive circuit layer; a light emitting diode including a substrate having a first surface and a second surface, a first semiconductor layer of a first conductivity type provided on the first surface of the substrate, a second semiconductor layer of a second conductivity type provided above the first semiconductor layer, a light emitting layer provided between the first semiconductor layer and the second semiconductor layer, a first electrode provided on the second semiconductor layer to have an area smaller than an area of the light emitting layer, and electrically connected to the first conductive circuit layer, and a second electrode provided on the second surface of the substrate, and electrically connected to the second conductive circuit layer, the light emitting diode being disposed between the first light transmissive support body and the second light transmissive support body; and a third light transmissive insulator embedded in a space between the first light transmissive support body and the second light transmissive support body. When an area of the first surface of the substrate is set to $S_1$, an area of the light emitting layer is set to $S_2$, and a distance from the first surface of the substrate to a surface of the first electrode is set to H, the light emitting diode has a shape satisfying a relation of $1 \leq S_1/S_2 \leq -(3.46/H)+2.73$.

Figure 1:
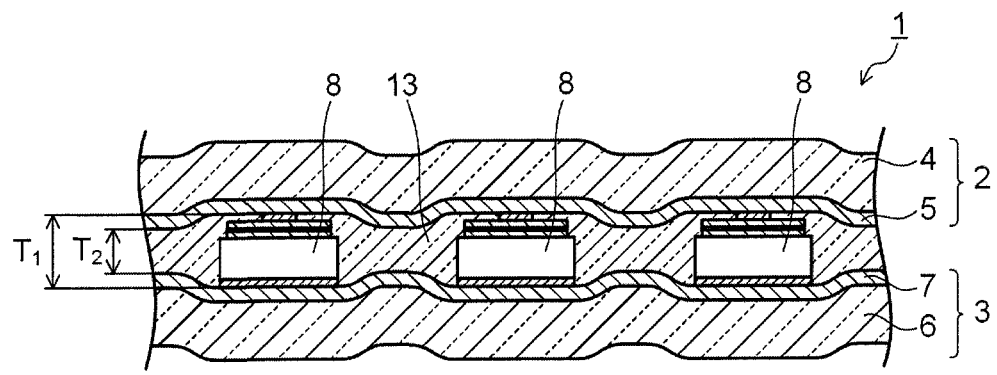
FIG. 1 is a sectional view illustrating a light emitting device of an embodiment.
Figure 2:
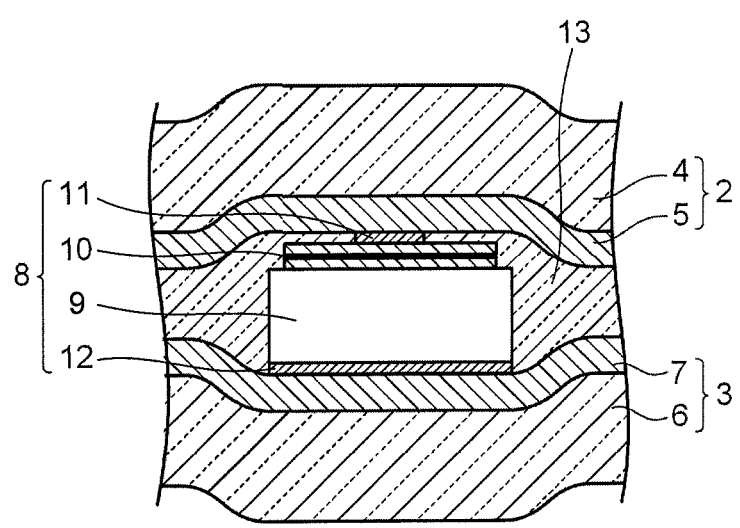
FIG. 2 is a sectional view illustrating, in an enlarged manner, a part of the light emitting device illustrated in FIG. 1.

A light emitting device of an embodiment will be described by referring to the drawings. FIG. 1 is a sectional view illustrating a configuration of the light emitting device according to the embodiment, and FIG. 2 is a sectional view illustrating, in an enlarged manner, a part of the light emitting device illustrated in FIG. 1. A light emitting device 1 illustrated in these drawings includes a first light transmissive support body 2 and a second light transmissive support body 3 which are disposed to face each other with a predetermined gap provided therebetween. The first light transmissive support body 2 includes a first light transmissive insulator 4 and a first conductive circuit layer 5 formed on a surface of the first light transmissive insulator 4. The second light transmissive support body 3 includes a second light transmissive insulator 6 and a second conductive circuit layer 7 formed on a surface of the second light transmissive insulator 6. The first light transmissive support body 2 and the second light transmissive support body 3 are disposed so that the first conductive circuit layer 5 and the second conductive circuit layer 7 face each other. In the gap between the first light transmissive support body 2 and the second light transmissive support body 3, a plurality of light emitting diodes 8 are disposed.

For each of the light transmissive insulators 4, 6, a resin material having an insulation property, a light transmitting property, and flexibility is used, for example. As a resin material as described above, there can be cited polyethylene terephthalate (PET), polyethylene naphthalate (PEN), polycarbonate (PC), polyethylene succinate (PES), cyclic olefin resin (for example, ARTON (product name) manufactured by JSR Corporation), acrylic resin and so on. Total light transmittances (JIS K7105) of the light transmissive insulators 4, 6 are preferably 90% or more, and more preferably 95% or more. A thickness of each of the light transmissive insulators 4, 6 is preferably in a range of 50 to 300 If the thickness of each of the light transmissive insulators 4, 6 is too thick, it becomes difficult to impart good flexibility to the light transmissive support bodies 2, 3, and further, the light transmitting property may also decrease. If the thickness of each of the light transmissive insulators 4, 6 is too thin, there is a possibility that characteristics as a formation base material of the conductive circuit layers 5, 7 cannot be sufficiently obtained.

On the surface of the first light transmissive insulator 4, the first conductive circuit layer 5 is formed. In like manner, on the surface of the second light transmissive insulator 6, the second conductive circuit layer 7 is formed. For each of the conductive circuit layers 5, 7, a transparent conductive material such as, for example, indium tin oxide (ITO), fluorine-doped tin oxide (FTO), zinc oxide, or indium zinc oxide (IZO) is used. As each of the conductive circuit layers 5, 7 made of the transparent conductive material, there can be cited one made by applying a sputtering method, an electron beam evaporation method or the like, for example, to form a thin film, and patterning the obtained thin film through laser beam machining, etching treatment or the like to form a circuit. Each of the conductive circuit layers 5, 7 may be one made by applying a mixture of fine particles (for example, fine particles having an average particle diameter in a range of 10 to 100 nm) of the transparent conductive material and a transparent resin binder into a circuit shape by screen printing or the like, or one made by performing patterning processing by the laser beam machining or photolithography on a coating film of the aforementioned mixture to form a circuit.

The conductive circuit layers 5, 7 are not limited to those made of the transparent conductive material, and they may also be obtained by forming fine particles of an opaque conductive material such as gold or silver in a mesh form. For example, the conductive circuit layers 5, 7 in the mesh form are formed by applying a photosensitive compound of the opaque conductive material such as silver halide, and then performing exposure and developing treatments. The conductive circuit layers 5, 7 may also be formed by applying slurry containing opaque conductive material fine particles in a mesh form by the screen printing or the like. The conductive circuit layers 5, 7 are only required to be those that exhibit the light transmitting property when they are formed on the surfaces of the light transmissive insulators 4, 6, and provide the light transmissive support bodies 2, 3. The conductive circuit layers 5, 7 preferably have light transmitting properties so that the total light transmittances (JIS K7105) of the light transmissive support bodies 2, 3 become 10% or more, and further, the total light transmittance as the entire light emitting device 1 becomes 1% or more. If the total light transmittance as the entire light emitting device 1 is less than 1%, a light emitting point becomes difficult to be recognized as a luminescent spot. The light transmitting properties of the conductive circuit layers 5, 7 themselves differ depending on their configurations, but, the total light transmittances are preferably in a range of 10 to 85%.

At a position between the surface of the first light transmissive support body 2 on which the first conductive circuit layer 5 is provided and the surface of the second light transmissive support body 3 on which the second conductive circuit layer 7 is provided, a plurality of light emitting diodes 8 are provided. As the light emitting diode, a diode chip having a PN junction (hereinafter, described as an LED chip 8) is generally used. The light emitting diode is not limited to the LED chip 8, and it may also be a laser diode (LD) chip or the like. The LED chip 8 includes, for example, a semiconductor substrate 9, a light emitting part 10 provided on a first surface (front surface) of the semiconductor substrate 9, a first electrode 11 provided on the light emitting part 10, and a second electrode 12 provided on a second surface (rear surface) of the semiconductor substrate 9. The substrate which forms the LED chip 8 is not limited to the semiconductor substrate 9, and it may be a substrate capable of realizing conduction between the electrodes 11 and 12. A concrete structure of the LED chip 8 will be described later in detail.

The first electrode 11 is electrically connected to the first conductive circuit layer 5 by being directly brought into contact with the first conductive circuit layer 5. Specifically, as will be described later, by pressing the first conductive circuit layer 5 against the first electrode 11, the first conductive circuit layer 5 and the first electrode 11 are electrically connected. In like manner, the second electrode 12 is electrically connected to the second conductive circuit layer 7 by being directly brought into contact with the second conductive circuit layer 7. Specifically, by pressing the second conductive circuit layer 7 against the second electrode 12, the second conductive circuit layer 7 and the second electrode 12 are electrically connected. The LED chip 8 lights up by a direct-current voltage applied thereto via the first and second electrodes 11, 12.

The first electrode 11 provided on a light emitting surface (a surface of the light emitting part 10) of the LED chip 8 has an area smaller than an area of the light emitting surface, in order not to prevent light emission from the light emitting part 10 from being released to the outside. The surface of the light emitting part 10 has a forming surface and a non-forming surface of the first electrode 11. Further, the first electrode 11 has a shape projecting from the light emitting surface. The second electrode 12 is provided on the entire non-light emitting surface of the LED chip 8 (rear surface of the semiconductor substrate 9). The surface (a contact surface with the conductive circuit layer 7) of the second electrode 12 preferably has a projecting and recessed shape of 1 μm or more, for example, and more preferably has a shape with repeated fine projections and recesses, in order to enhance the electrical connection reliability and the like with the second conductive circuit layer 7. The surface (a contact surface with the conductive circuit layer 5) of the first electrode 11 also preferably has the similar projecting and recessed shape.

In a portion except portions at which the plurality of LED chips 8 are disposed, in the gap between the first light transmissive support body 2 and the second light transmissive support body 3, a third light transmissive insulator 13 is embedded. The third light transmissive insulator 13 preferably has a Vicat softening temperature in a range of 80 to 160° C. The third light transmissive insulator 13 preferably has a tensile storage elastic modulus in a range of 0.01 to 10 GPa. The tensile storage elastic modulus indicates a value between 0° C. and 100° C. The Vicat softening temperature of the third light transmissive insulator 13 is more preferably in a range of 100 to 140° C., and the tensile storage elastic modulus is more preferably in a range of 0.1 to 7 GPa.

Further, it is more preferable that the third light transmissive insulator 13 does not melt at the Vicat softening temperature, and has a tensile storage elastic modulus at the Vicat softening temperature of 0.1 MPa or more. It is more preferable that the third light transmissive insulator 13 has a melting temperature of 180° C. or higher, or a melting temperature which is higher by 40° C. or more than the Vicat softening temperature. In addition, the third light transmissive insulator 13 preferably has a glass transition temperature of −20° C. or lower. The glass transition temperature of the third light transmissive insulator 13 is more preferably −40° C. or lower.

The Vicat softening temperature of the third light transmissive insulator 13 is a value determined under conditions in which a test load is 10 N, and a rate of heating is 50° C./hour, and under A50 condition described in JIS K7206 (ISO 306: 2004). The glass transition temperature and the melting temperature are values determined by a method based on JIS K7121 (ISO 3146), using a differential scanning calorimeter, at a rate of heating of 5° C./minute, by heat flux differential scanning calorimetry. The tensile storage elastic modulus is a value determined based on JIS K7244-1 (ISO 6721), using a dynamic viscoelasticity automatic measuring device, at a rate of uniform heating of 1° C./minute from −100° C. to 200° C., and at a frequency of 10 Hz.

The third light transmissive insulator 13 is preferably made of a light transmissive insulating resin satisfying characteristics such as the above-described Vicat softening temperature, tensile storage elastic modulus, melting temperature, and glass transition temperature, in particular, an elastomer. The elastomer is preferably at least one selected from an acryl-based elastomer, an olefin-based elastomer, a styrene-based elastomer, an ester-based elastomer, and an urethane-based elastomer. Out of the above, the acryl-based elastomer satisfying the above-described characteristics is suitable for the composing material of the third light transmissive insulator 13, since it is excellent in flowability when softened, adhesiveness after curing, and weather resistance, in addition to a light transmitting property, an electric insulation property, and flexibility. The third light transmissive insulator 13 is preferably made of the material containing the elastomer as described above as a main component, and may contain another resin component according to need.

A thickness of the third light transmissive insulator 13 may be equal to the gap between the first light transmissive support body 2 and the second light transmissive support body 3 based on a height $T_1$ of the LED chip 8 (a height from the surface of the first electrode 11 to the surface of the second electrode 12). It is preferable that, in order to increase the contact property between the conductive circuit layers 5, 7, and the electrodes 11, 12, the thickness of the third light transmissive insulator 13 is partially smaller than the thickness based on the height $T_1$ of the LED chip 8. In other words, each of the light transmissive support bodies 2, 3 which are bought into close contact with the third light transmissive insulator 13 preferably has a shape curved inward from a portion where the LED chip 8 is disposed toward an intermediate portion between the LED chip 8 and the LED chip 8 adjacent thereto. The first and second light transmissive support bodies 2, 3 have shapes curved inward from opposite directions, respectively. By employing the shapes of the light transmissive support bodies 2, 3 as described above, the first conductive circuit layer 5 in the first light transmissive support body 2 is pressed against the first electrode 11, and the second conductive circuit layer 7 in the second light transmissive support body 3 is pressed against the second electrode 12. Therefore, it becomes possible to increase the electrical connection between the conductive circuit layers 5, 7, and the electrodes 11, 12, and the electrical connection reliability.

The third light transmissive insulator 13 preferably has a minimum thickness $T_2$ which is, in a range, smaller than the height $T_1$ of the LED chip 8 by 5 μm or more, and smaller than the height $T_1$ by ½ or less of the height $T_1$, namely, a minimum thickness $T_2$ between the adjacent LED chips 8. In other words, a difference $\Delta T$ ($T_1-T_2$) between the height $T_1$ of the LED chip 8 and the minimum thickness $T_2$ of the third light transmissive insulator 13 is preferably in a range of not less than 5 μM or more and ½ $T_1$ or less. If the thickness difference ΔT is less than 5 μm, the force of pressing the conductive circuit layers 5, 7 against the electrodes 11, 12 becomes insufficient, and thus there is a possibility that the electrical connection state between the conductive circuit layers 5, 7, and the electrodes 11, 12, in particular, the electrical connection state in a bending resistance test and a thermal cycle test becomes unstable. If the thickness difference ΔT exceeds ½ of the height $T_1$ (½ $T_1$), maintenance of the shape of the third light transmissive insulator 13 may become difficult or the adhesiveness with respect to the LED chip 8 or the like may decrease. The thickness difference ΔT is more preferably in a range of 20 to 80 μm.

Further, by using the resin having the above-described Vicat softening temperature and melting temperature, it is possible to successfully embed the third light transmissive insulator 13 between the first light transmissive support body 2 and the second light transmissive support body 3, in a state where the third light transmissive insulator 13 is brought into close contact with the plurality of LED chips 8. The contact state between the conductive circuit layers 5, 7, and the electrodes 11, 12 is maintained by the third light transmissive insulator 13 disposed in a state of being brought into close contact with the peripheries of the LED chips 8. Accordingly, the electrical connection state between the conductive circuit layers 5, 7, and the electrodes 11, 12 can be maintained more successfully. If the Vicat softening temperature of the resin exceeds 160° C., the resin cannot be sufficiently fluidized in a process of forming the third light transmissive insulator 13, which may reduce the electrical connection between the conductive circuit layers 5, 7, and the electrodes 11, 12. If the Vicat softening temperature of the resin is less than 80° C., the power for holding the LED chips 8 becomes insufficient, which may reduce the electrical connection reliability between the conductive circuit layers 5, 7, and the electrodes 11, 12.

Regarding a state in a periphery of the first electrode 11, it is preferable to dispose the third light transmissive insulator 13 also at the periphery of the first electrode 11. In a case where the first electrode 11 has an area which is sufficiently smaller than an area of the light emitting surface (the surface of the light emitting part 10) of the LED chip 8, and a shape projecting from the light emitting surface, a space is generated between the surface on which the first electrode 11 is not formed (the non-forming surface of the first electrode 11) within the light emitting surface (the surface of the light emitting part 10) and the first conductive circuit layer 5, in a state where the first electrode 11 is brought into contact with the first conductive circuit layer 5. The third light transmissive insulator 13 is preferably filled also in a minute space between the non-forming surface of the first electrode 11 within the light emitting surface and the first conductive circuit layer 5. The filling state of the third light transmissive insulator 13 in the minute space can be improved by using the resin having the above-described Vicat softening temperature, melting temperature, and the like.

Figure 3:
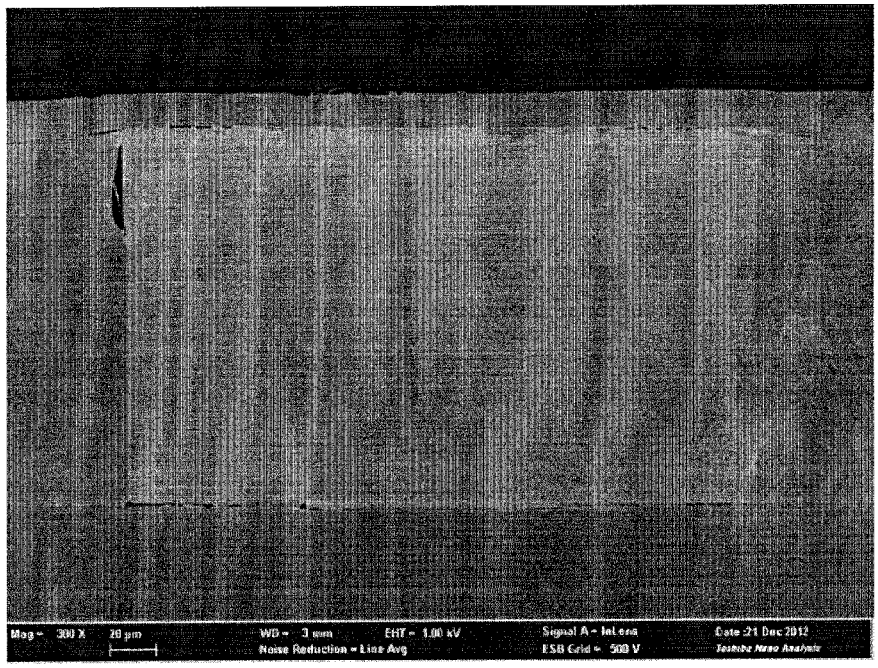
FIG. 3 is a SEM image indicating, in an enlarged manner, a part on which a light emitting diode in the light emitting device illustrated in FIG. 1 is disposed.

FIG. 3 is a SEM image indicating, in an enlarged manner, the LED chip 8 and a periphery thereof in the light emitting device 1. As is apparent from FIG. 3, the third light transmissive insulator 13 is filled between the non-forming surface of the first electrode 11 within the light emitting surface and the conductive circuit layer 5. As described above, the third light transmissive insulator 13 is filled between the light emitting surface of the LED chip 8 and the conductive circuit layer 5 so that a part of the third light transmissive insulator 13 exists in a state of being brought into close contact with the periphery of the electrode 11, resulting in that the contact state between the electrode 11 and the conductive circuit layer 5 can be successfully maintained by the third light transmissive insulator 13. Specifically, even when the light emitting device 1 is bent, the contact state between the electrode 11 and the conductive circuit layer 5 is successfully maintained. Therefore, it becomes possible to increase the electrical connection reliability between the first conductive circuit layer 5 and the first electrode 11 of the LED chip 8 with higher reproducibility.

Regarding the contact structure between the second conductive circuit layer 7 and the second electrode 12 of the LED chip 8, the third light transmissive insulator 13 exists in a state of being brought into close contact with the periphery of the second electrode 12, so that the contact state is successfully maintained. Further, when the surface of the second electrode 12 has the projecting and recessed shape, the projections in the projecting and recessed shape can be directly brought into contact with the conductive circuit layer 7 to form electrical connection regions, and the third light transmissive insulator 13 can be filled in the recesses to form mechanical coupling regions. Specifically, the electrical connection regions where the conductive circuit layer 7 and the electrode 12 are brought into direct contact with each other, and the mechanical coupling regions where the part of the third light transmissive insulator 13 intervenes between the conductive circuit layer 7 and the electrode 12, are formed on a contact interface between the conductive circuit layer 7 and the electrode 12. This makes it possible to increase the mechanical coupling property while maintaining the electrical connection between the conductive circuit layer 7 and the electrode 12.

The contact interface having the above-described electrical connection regions and mechanical coupling regions is effective not only to the contact portion between the second conductive circuit layer 7 and the second electrode 12 but also to the contact portion between the first conductive circuit layer 5 and the first electrode 11. The contact interfaces having the electrical connection regions and the mechanical coupling regions can be obtained not only when the surfaces of the electrodes 11, 12 have the projecting and recessed shapes but also when the electrodes have relatively flat surfaces, by using the resin having the above-described Vicat softening temperature, melting temperature, and the like, and controlling a vacuum thermocompression bonding condition and the like of later-described resin sheets. Specifically, by controlling a drawn state and the like of the resin when the resin sheets are subjected to vacuum thermocompression bonding, it is possible to obtain the contact interfaces between the conductive circuit layers 5, 7, and the electrodes 11, 12, having the electrical connection regions and the mechanical coupling regions. This makes it possible to further increase the electrical connection reliability between the conductive circuit layers 5, 7, and the electrodes 11, 12.

Next, a concrete structure of the LED chip 8 will be described with reference to FIG. 4 to FIG. 8. The LED chip 8 includes the semiconductor substrate 9, the light emitting part 10, the first electrode 11, and the second electrode 12, as described above. As a concrete structure of the light emitting part 10, there can be cited a structure having a first semiconductor layer 14 of a first conductivity type (P-type or N-type, for example) and a second semiconductor layer 15 of a second conductivity type (N-type or P-type, for example) formed in order on the semiconductor substrate 9, and a light emitting layer 16 (an active layer or the like formed of a PN junction interface or a non-doped semiconductor layer, for example) provided between the semiconductor layers 14 and 15. On the second semiconductor layer 15, the first electrode 11 in a pad shape having an area sufficiently smaller than an area of the light emitting layer 16 is provided. In order to increase the reliability of the light emitting part 10, the light emitting layer 16 is preferably formed at a position which is deep, by 1 μm or more, from a lower surface of the first electrode 11, and is desirably formed at a position which is deep, by 2 μm or more, from the lower surface.

Figure 4:
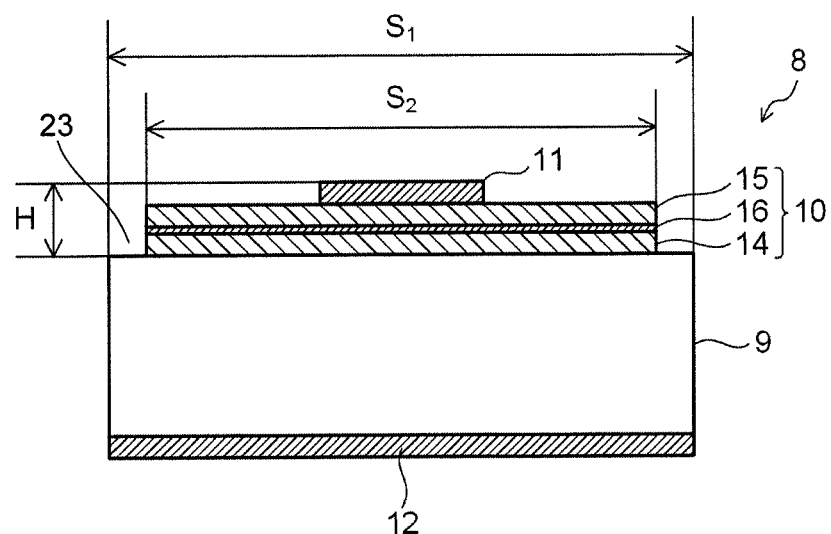
FIG. 4 is a sectional view illustrating a first configuration example of a light emitting diode used for the light emitting device illustrated in FIG. 1.
Figure 5:
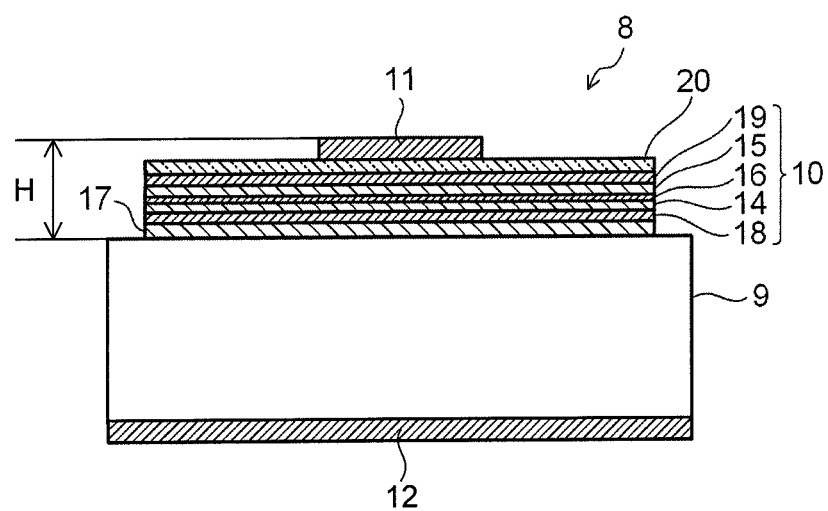
FIG. 5 is a sectional view illustrating a second configuration example of the light emitting diode used for the light emitting device illustrated in FIG. 1.

FIG. 4 illustrates a basic structure of the LED chip 8, and the LED chip 8 may also include, other than the above-described respective layers, a reflective film, an adhesive layer, a buffer layer, a contact layer, a current diffusion layer, a transparent electrode layer, or the like. FIG. 5 illustrates a configuration example of the LED chip 8 having a double heterojunction structure. In the LED chip 8 illustrated in FIG. 5, a reflective film 17 of distributed Bragg type is provided on the semiconductor substrate 9. The light emitting part 10 is provided on the reflective film 17. The light emitting part 10 has a contact layer 18 of a first conductivity type (P-type, for example), a cladding layer 14 of the first conductivity type (P-type, for example), an active layer 16, a cladding layer 15 of a second conductivity type (N-type, for example), and a contact layer 19 of the second conductivity type (N-type, for example), formed in order on the reflective film 17. On the contact layer 19 of the second conductivity type, a transparent electrode layer 20 is formed, and on the transparent electrode layer 20, the first electrode (pad electrode) 11 is provided. These respective layers are added according to need, and are omitted depending on circumstances. The LED chip 8 may also have, other than the above-described respective layers, a buffer layer, a protective layer, a current diffusion layer, or the like.

The LED chips 8 are produced by forming respective layers (a stack of thin films) and the like forming the light emitting part 10, in order, on a semiconductor wafer to be the semiconductor substrate 9, and then dicing the semiconductor wafer in chip shapes. The dicing of the semiconductor wafer is generally carried out by blade dicing using a diamond blade. At this time, in order to prevent the thin films (the stack of thin films) forming the light emitting part 10 from peeling at the time of dicing the semiconductor wafer, element isolation trenches are generally formed on the stack of thin films through dry etching, laser dicing, or the like. A width of the element isolation trench is set to be wider than a cutting width of the blade dicing.

Figure 6A:
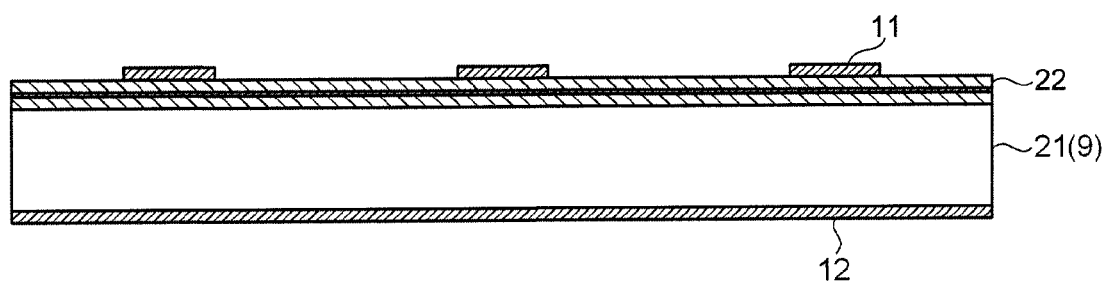
FIG. 6A is a sectional view illustrating a formation process of a light emitting part and electrodes in a manufacturing process of the light emitting diodes used for the light emitting device illustrated in FIG. 1.
Figure 6B:
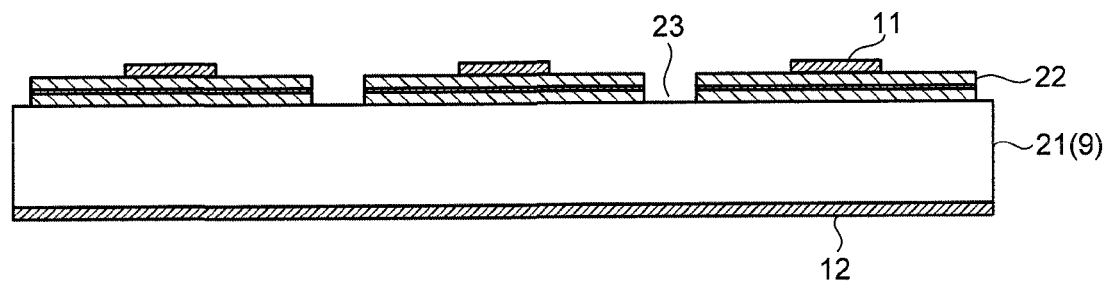
FIG. 6B is a sectional view illustrating a process of forming element isolation trenches on the light emitting part in the manufacturing process of the light emitting diodes used for the light emitting device illustrated in FIG. 1.
Figure 6C:
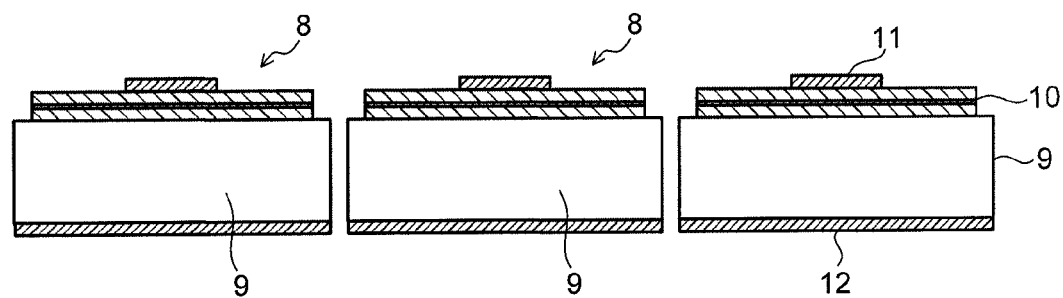
FIG. 6C is a sectional view illustrating a dividing process in the manufacturing process of the light emitting diodes used for the light emitting device illustrated in FIG. 1.

A manufacturing process of the LED chips 8 will be described in detail with reference to FIG. 6A to FIG. 6C. As illustrated in FIG. 6A, a stack of thin films 22 which forms the light emitting part 10 is formed on a first surface of a semiconductor wafer 21 to be the semiconductor substrate 9. On the stack of thin films 22, the first electrodes 11 are formed, and the second electrode 12 is formed on a second surface of the semiconductor wafer 21. As illustrated in FIG. 6B, element isolation trenches 23 are formed on the stack of thin films 22. A width of the element isolation trench 23 is set to be wider than a cutting width of blade dicing. As illustrated in FIG. 6C, a center of each of the element isolation trenches 23 is diced to divide the semiconductor wafer 21 into a plurality of semiconductor substrates 9, to thereby produce a plurality of LED chips 8. By setting the width of the element isolation trench 23 to be wider than the dicing width, and cutting only the semiconductor wafer 21 by the blade dicing, occurrence of chipping and peeling caused by dicing the stack of thin films 22 by the blade, is prevented.

Incidentally, an electronic component for electronic apparatus is often required to normally operate at a temperature up to about 45° C., as an operating temperature range. However, regarding a conventional light emitting device having flexibility, although the device normally operates under a temperature environment of about 20° C., if the device is in a bent state so that its light emitting surface side is projected under an environmental temperature close to an upper limit of general operating temperature condition, or a pressure is applied to the device when a surface of the device in the vicinity of the LED chip is pressed by a finger or another component or the like is brought into contact with the device, a phenomenon such that the LED chip does not light up or the luminous intensity of the LED chip is reduced, has been observed. As a result of conducting earnest studies regarding the reason of the occurrence of such phenomenon, it was found out that by employing the chip manufacturing process as described above, a surface of an outer peripheral portion of the semiconductor substrate 9 is put in an exposed state, and the exposed portion of the semiconductor substrate 9 is easily brought into contact with the first conductive circuit layer 5 electrically connected to the first electrode 11, resulting in that the reduction in the luminous intensity, the short circuit, or the like of the light emitting part 10 occurs.

Specifically, when the above-described chip manufacturing process is employed, there is created a state such that the light emitting part 10 does not exist on the outer peripheral portion of the surface (the forming surface of the light emitting part 10) of the semiconductor substrate 9 based on the element isolation trenches 23. Since the LED chip 8 has a shape such that the area $S_2$ of the light emitting part 10 is smaller than the area $S_1$ of the semiconductor substrate 9, as illustrated in FIG. 4, the surface of the outer peripheral portion of the semiconductor substrate 9 is exposed. If the LED chip 8 having the semiconductor substrate 9 whose outer peripheral portion is exposed is applied to the light emitting device 1, there is a possibility that the first conductive circuit layer 5 electrically connected to the first electrode 11 is brought into contact with the exposed portion of the semiconductor substrate 9 when the light emitting device 1 is bent under the environmental temperature close to the upper limit of the operating temperature condition, in particular, or when a pressure is locally applied to the vicinity of the LED chip 8. If the first conductive circuit layer 5 is brought into contact with the exposed portion of the semiconductor substrate 9, there arises a problem such that the luminous intensity of the light emitting part 10 reduces, and the LED chip 8 does not light up due to the short circuit of the light emitting part 10.

Figure 7:
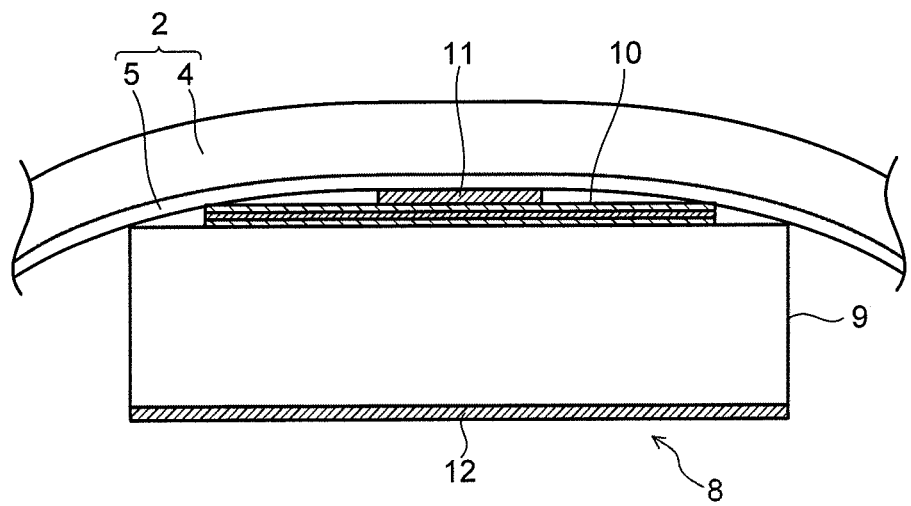
FIG. 7 is a view for explaining a problem caused when a first conductive circuit layer and an exposed portion of a substrate of the light emitting diode in the light emitting device illustrated in FIG. 1 are brought into contact with each other.

When the light emitting device 1 is bent, there is a possibility that the first conductive circuit layer 5 electrically connected to the first electrode 11 is brought into contact with the exposed portion of the semiconductor substrate 9, as illustrated in FIG. 7. The contact between the first conductive circuit layer 5 and the semiconductor substrate 9 easily occurs particularly when the light emitting device 1 is bent under the environmental temperature close to the upper limit of the operating temperature condition. Further, by reducing the minimum thickness $T_2$ of the third light transmissive insulator 13 to a thickness smaller than the thickness based on the height $T_1$ of the LED chip 8, the electrical connection reliability between the first conductive circuit layer 5 and the first electrode 11 can be increased, but, the first conductive circuit layer 5 and the exposed portion of the semiconductor substrate 9 are easily brought into contact with each other. For this reason, the reduction in the luminous intensity or the short circuit of the light emitting part 10 easily occurs, which causes a problem such that the LED chip 8 does not light up.

The smaller a ratio of the area $S_1$ of the semiconductor substrate 9 to the area of the light emitting part 10 (an area of the light emitting layer 16) $S_2$ ($S_1/S_2$), and the smaller a distance H from the surface (the forming surface of the light emitting part 10) of the semiconductor substrate 9 to the surface of the first electrode 11, the higher the possibility that the exposed portion of the semiconductor substrate 9 is brought into contact with the first conductive circuit layer 5. The distance H is set to indicate a distance from the surface of the semiconductor substrate 9 to an exposed surface of the electrode 11 having a pad shape, regardless of whether another layer of a transparent electrode or the like exists between the light emitting part 10 and the first electrode 11. The distance H is not limited to the distance from the surface on which the semiconductor substrate 9 is completely exposed to the surface of the electrode 11, and when a conductive film is formed on the semiconductor substrate 9, the distance H is set to a distance from a surface of the film to the surface of the electrode 11.

When the area ratio between the semiconductor substrate 9 and the light emitting part 10 ($S_1/S_2$) is 1, namely, when the entire surface of the semiconductor substrate 9 is covered by the light emitting part 10 so that the area $S_1$ of the semiconductor substrate 9 and the area of the light emitting part 10 (the area of the light emitting layer 16) $S_2$ are equal, even if the first light transmissive support body 2 or the entire light emitting device 1 is bent, the first conductive circuit layer 5 is only brought into contact with the outer peripheral portion of the light emitting part 10, so that there arises no problem such as the short circuit of the light emitting part 10. Accordingly, the LED chip 8 may have a structure in which the $S_1/S_2$ ratio is 1. However, if the area $S_1$ of the semiconductor substrate 9 and the area $S_2$ of the light emitting part 10 are equal, this means that the peeling or the like of the light emitting part 10 easily occurs in the manufacturing process of the LED chip 8 described above. Therefore, the area $S_2$ of the light emitting part 10 is preferably smaller than the area $S_1$ of the semiconductor substrate 9, and further, the $S_1/S_2$ ratio is more preferably 1.2 or more, by taking a margin in the blade dicing and the like into consideration.

When the area ratio between the semiconductor substrate 9 and the light emitting part 10 ($S_1/S_2$) is larger than 1, there is a possibility that the first conductive circuit layer 5 and the exposed portion of the semiconductor substrate 9 are brought into contact with each other, as described above. As a countermeasure against such a point, by setting the distance H from the surface of the semiconductor substrate 9 to the surface of the first electrode 11 in accordance with the value of $S_1/S_2$, when the first light transmissive support body 2 or the entire light emitting device 1 is bent, it is possible to prevent the first conductive circuit layer 5 from being brought into contact with the exposed portion of the semiconductor substrate 9. Concretely, by setting the distance H from the surface of the semiconductor substrate 9 to the surface of the first electrode 11 so that a value of "$-(3.46/H)+2.73$" becomes equal to or greater than the value of $S_1/S_2$, it becomes possible to prevent the contact between the first conductive circuit layer 5 and the exposed portion of the semiconductor substrate 9.

Figure 8:
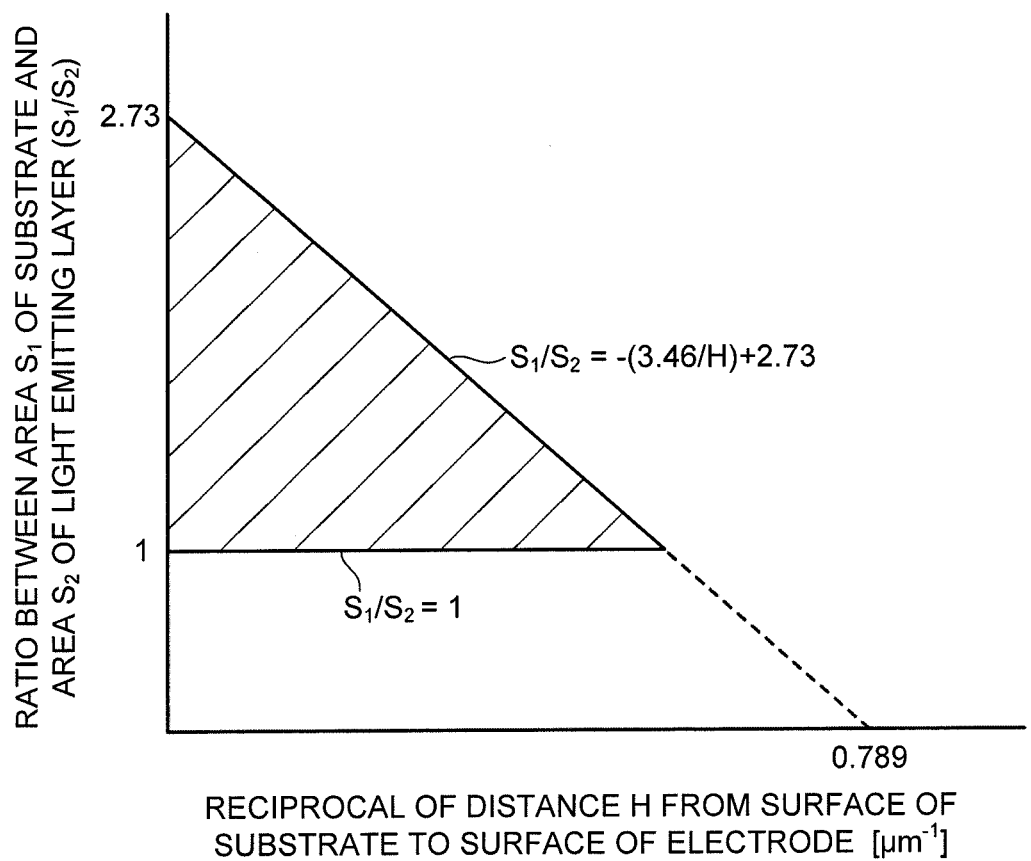
FIG. 8 is a view illustrating a relation between a reciprocal of a distance H from a first surface of a substrate to a surface of a first electrode (1/H) and a ratio of an area $S_1$ of the first surface of the substrate to an area $S_2$ of a light emitting layer ($S_2/S_1$).

By employing the LED chip 8 in which the area ratio $S_1/S_2$ between the semiconductor substrate 9 and the light emitting part 10 and the distance H from the surface of the semiconductor substrate 9 to the surface of the first electrode 11 satisfy a relation of "$1 \leq S_1/S_2 \leq -(3.46/H)+2.73$", namely, a relation within a shadowed region illustrated in FIG. 8, the contact between the first conductive circuit layer 5 and the exposed portion of the semiconductor substrate 9 is prevented. Even in a case where the light emitting device 1 is bent under a high-temperature environment, in particular, or when a pressure is locally applied to the vicinity of the LED chip 8, it is possible to suppress the occurrence of problem such as the short circuit of the light emitting part 10. Therefore, it becomes possible to provide the light emitting device 1 which improves the lighting reliability by suppressing the non-lighting, the reduction in luminous intensity and the like of the LED chip 8. The area ratio $S_1/S_2$ and the distance H preferably satisfy a relation of "$1 \leq S_1/S_2 \leq -(3.46/H)+2.73$", and more preferably satisfy a relation of "$1.2 \leq S_1/S_2 \leq -(3.46/H)+2.73$".

Next, a manufacturing method of the light emitting device 1 of the embodiment will be described with reference to FIG. 9A to FIG. 9E. First, the above-described chip manufacturing process and the like are employed to produce the LED chips 8 in each of which the area ratio $S_1/S_2$ between the semiconductor substrate 9 and the light emitting part 10 and the distance H satisfy the relation of "$1 \leq S_1/S_2 \leq -(3.46/H)+2.73$". The concrete structure of the LED chip 8 is as described above. Next, the first light transmissive support body 2 having the first light transmissive insulator 4 and the first conductive circuit layer 5 formed on the surface of the first light transmissive insulator 4, and the second light transmissive support body 3 having the second light transmissive insulator 6 and the second conductive circuit layer 7 formed on the surface of the second light transmissive insulator 6, are prepared.

Next, first and second light transmissive insulating resin sheets 31, 32 are prepared. Each of the light transmissive insulating resin sheets 31, 32 is preferably an elastomer sheet having a Vicat softening temperature in a range of 80 to 160° C., and is more preferably an acryl-based elastomer sheet. A tensile storage elastic modulus of the elastomer sheet as each of the light transmissive insulating resin sheets 31, 32 is preferably in a range of 0.1 to 7 GPa. Further, it is preferable that the elastomer sheet does not melt at the Vicat softening temperature, and has a tensile storage elastic modulus at the Vicat softening temperature of 0.1 MPa or more. It is preferable that the elastomer sheet has a melting temperature of 180° C. or higher, or a melting temperature which is higher by 40° C. or more than the Vicat softening temperature. A glass transition temperature of the elastomer sheet is preferably −20° C. or lower.

Figure 9A:
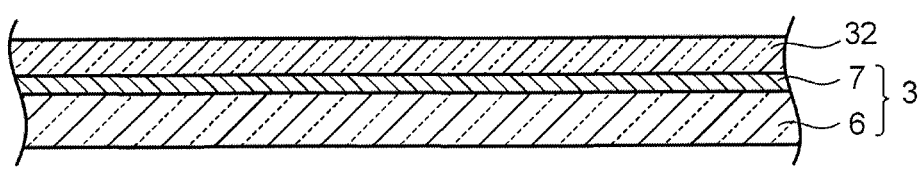
FIG. 9A is a sectional view illustrating a process of preparing a second light transmissive support body and a second light transmissive insulating resin sheet in a manufacturing process of the light emitting device of the embodiment.
Figure 9B:
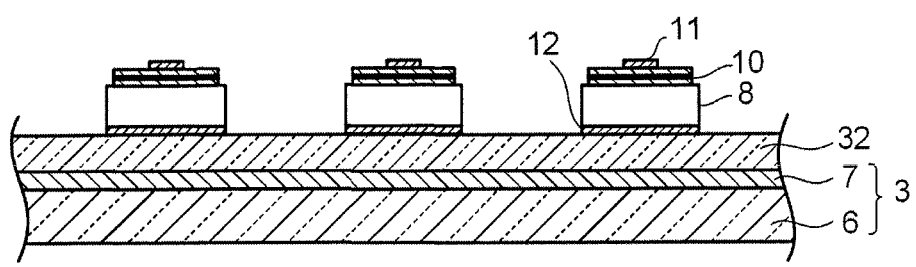
FIG. 9B is a sectional view illustrating a process of disposing light emitting diodes on the second light transmissive support body in the manufacturing process of the light emitting device of the embodiment.
Figure 9C:
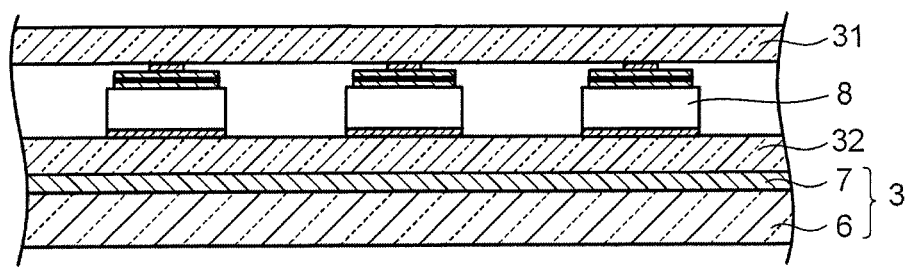
FIG. 9C is a sectional view illustrating a process of disposing a first light transmissive insulating resin sheet in the manufacturing process of the light emitting device of the embodiment.
Figure 9D:
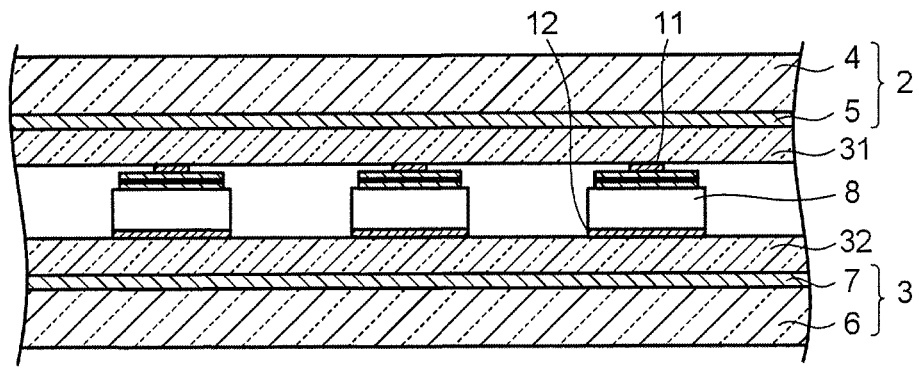
FIG. 9D is a sectional view illustrating a process of disposing a first light transmissive support body in the manufacturing process of the light emitting device of the embodiment.

As illustrated in FIG. 9A, the second light transmissive insulating resin sheet 32 is disposed on the second conductive circuit layer 7 of the second light transmissive support body 3 so as to cover the entire conductive circuit layer 7. The second light transmissive insulating resin sheet 32 has a shape capable of covering the entire conductive circuit layer 7 including portions to be positions at which the LED chips 8 are disposed on the conductive circuit layer 7, and further, the entire light transmissive insulator 6. As illustrated in FIG. 9B, the plurality of LED chips 8 are disposed on the second light transmissive insulating resin sheet 32. The plurality of LED chips 8 are disposed so that the second electrodes 12 thereof are respectively positioned on the second light transmissive insulating resin sheet 32 side (the second conductive circuit layer 7 side). Further, as illustrated in FIG. 9C, the first light transmissive insulating resin sheet 31 is disposed on the plurality of LED chips 8. As illustrated in FIG. 9D, the first light transmissive support body 2 is disposed on the first light transmissive insulating resin sheet 31.

The first light transmissive support body 2 is disposed so that the first conductive circuit layer 5 thereof faces the first light transmissive insulating resin sheet 31. The first light transmissive insulating resin sheet 31 has a shape capable of covering the entire conductive circuit layer 5 including portions to be positions at which the LED chips 8 are disposed on the conductive circuit layer 5, and further, the entire light transmissive insulator 4. Therefore, in the first light transmissive support body 2 disposed on the first light transmissive insulating resin sheet 31, the entire first conductive circuit layer 5 is covered by the first light transmissive insulating resin sheet 31. By conducting the processes illustrated in FIG. 9A to FIG. 9D, each of the LED chips 8 is disposed between the first light transmissive insulating resin sheet 31 and the second light transmissive insulating resin sheet 32 so that the first electrode 11 is positioned on the first light transmissive insulating resin sheet 31 side, and the second electrode 12 is positioned on the second light transmissive insulating resin sheet 32 side.

The first and second light transmissive insulating resin sheets 31, 32 are only required to have thicknesses capable of sufficiently filling a space between the first light transmissive support body 2 and the second light transmissive support body 3, namely, a space based on a gap between the first light transmissive support body 2 and the second light transmissive support body 3 generated by disposing the LED chips 8, in a vacuum thermocompression bonding process to be described below. Concretely, a total thickness of the first and second light transmissive insulating resin sheets 31, 32 is only required to be a thickness which is sufficient for forming the third light transmissive insulator 13 having a shape based on the difference $\Delta T$ ($T_1 - T_2$) between the height $T_1$ of the LED chip 8 and the minimum thickness $T_2$ of the third light transmissive insulator 13, for example.

Figure 9E:
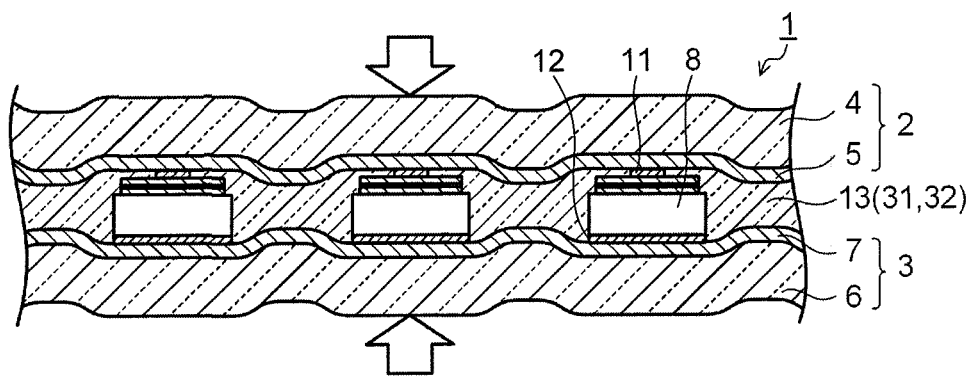
FIG. 9E is a sectional view illustrating a thermocompression bonding process in the manufacturing process of the light emitting device of the embodiment.

As illustrated in FIG. 9E, a stack formed by stacking the second light transmissive support body 3, the second light transmissive insulating resin sheet 32, the LED chips 8, the first light transmissive insulating resin sheet 31, and the first light transmissive support body 2, in order, is pressurized while being heated in a vacuum atmosphere. The pressurizing process of the stack is preferably carried out by using a pressure device (a pressure device having a pressure plate provided with an elastic body such as rubber on a surface) capable of locally applying a pressure between adjacent LED chips 8 so that the minimum thickness $T_2$ of the third light transmissive insulator 13 becomes smaller than the height $T_1$ of the LED chip 8, for example.

The heating and pressurizing process (vacuum thermocompression bonding process) of the stack in the vacuum atmosphere is preferably carried out by pressurizing the stack while heating the stack to a temperature T in a range of Mp−10(° C.)≤T≤Mp+20(° C.) with respect to a Vicat softening temperature Mp (° C.) of the light transmissive insulating resin sheets 31, 32. By employing the heating condition as described above, it is possible to pressurize the stack in a state where the light transmissive insulating resin sheets 31, 32 are moderately softened. Accordingly, it is possible to embed, without a gap, the softened light transmissive insulating resin sheets 31, 32 in the space between the first light transmissive support body 2 and the second light transmissive support body 3, while connecting the first electrodes 11 disposed on the conductive circuit layer 5 via the light transmissive insulating resin sheet 31 to predetermined positions on the first conductive circuit layer 5, and connecting the second electrodes 12 disposed on the conductive circuit layer 7 via the light transmissive insulating resin sheet 32 to predetermined positions on the second conductive circuit layer 7, to thereby form the third light transmissive insulator 13.

If the heating temperature T when performing the thermocompression bonding on the stack is below a temperature lower by 10(° C.) than the Vicat softening temperature Mp of the light transmissive insulating resin sheets 31, 32 (T<Mp−10), there is a possibility that the softening of the light transmissive insulating resin sheets 31, 32 becomes insufficient, and the adhesiveness of the light transmissive insulating resin sheets 31, 32 (eventually, the third light transmissive insulator 13) with respect to the LED chip 8 reduces. Further, there is a possibility that the light transmissive insulating resin sheets 31, 32 (eventually, the third light transmissive insulator 13) cannot be successfully filled in the space between the non-forming surface of the electrode 11 within the light emitting surface (the surface of the light emitting part 10) of the LED chip 8 and the conductive circuit layer 5. If the heating temperature T exceeds a temperature higher by 20(° C.) than the Vicat softening temperature Mp of the light transmissive insulating resin sheets 31, 32 (Mp+20<T), there is a possibility that the light transmissive insulating resin sheets 31, 32 are softened too much to cause a defective shape and the like.

The thermocompression bonding process of the stack in the vacuum atmosphere is preferably carried out in the following manner. The above-described stack is subjected to preliminarily pressurization to make the respective components bring into close contact with one another. Next, a working space in which the preliminarily-pressurized stack is disposed is evacuated, and then the stack is pressurized while being heated to the temperature as described above. In the above-described manner, by performing the thermocompression bonding on the preliminarily-pressurized stack in the vacuum atmosphere, it is possible to embed, with no gap, the softened light transmissive insulating resin sheets 31, 32 in the space between the first light transmissive support body 2 and the second light transmissive support body 3. The vacuum atmosphere when performing the thermocompression bonding is preferably set to 5 Pa or less. It is also possible to omit the preliminarily pressurization process, but, in this case, positional displacement or the like easily occurs in the stack, so that it is preferable to perform the preliminarily pressurization process.

If the thermocompression bonding process of the stack is performed under an air atmosphere or under reduced pressure with high vacuum pressure, bubbles are likely to remain in the light emitting device 1 after being subjected to the thermocompression bonding, in particular, in the peripheries of the LED chips 8. The bubbles remained in the light emitting device 1 are pressurized, so that they cause swelling of the light emitting device 1 after being subjected to the thermocompression bonding or peeling of the LED chips 8 from the light transmissive support bodies 2, 3. Further, if the bubbles and swelling exist inside the light emitting device 1, in particular, the vicinities of the LED chips 8, light is non-uniformly scattered and there arises a problem in terms of external appearance of the light emitting device 1, which is unfavorable. According to the embodiment, it is possible to suppress the generation of bubbles in the light emitting device 1, based on the various characteristics of the third light transmissive insulator 13 and the vacuum thermocompression bonding conditions. It is preferable that in the light emitting device 1 of the embodiment, there exists no bubble having an outside diameter of 500 μm or more or a size equal to or greater than an external shape size of the LED chip 8.

The pressurizing force applied when performing the thermocompression bonding on the stack is normally in a range of 0.5 to 20 MPa, and is preferably set to fall within a range of 1 to 12 MPa, although it differs depending on the heating temperature, the material and the thickness of the light transmissive insulating resin sheets 31, 32, the final thickness of the third light transmissive insulator 13, and the like. By employing the pressurizing force as described above, it is possible to increase the embedding property of the light transmissive insulating resin sheets 31, 32 in the gap between the first light transmissive support body 2 and the second light transmissive support body 3. Further, it is possible to suppress the reduction in characteristics, breakage, and the like of the LED chips 8.

As described above, by performing the vacuum thermocompression bonding process in the state where the first light transmissive insulating resin sheet 31 is intervened between the first conductive circuit layer 5 and the first electrodes 11 of the LED chips 8, and the second light transmissive insulating resin sheet 32 is intervened between the second conductive circuit layer 7 and the second electrodes 12 of the LED chips 8, it is possible to control the thickness of the third light transmissive insulator 13 to fall within the desired range while electrically connecting between the first electrodes 11 and the first conductive circuit layer 5 and between the second electrodes 12 and the second conductive circuit layer 7. Further, it is possible to make the third light transmissive insulator 13 bring into close contact with the peripheries of the LED chips 8 including the peripheries of the first electrodes 11. Therefore, it becomes possible to obtain the light emitting device 1 in which the electrical connection reliability between the conductive circuit layers 5, 7, and the electrodes 11, 12 is increased.

Further, by controlling the heating temperature or the pressurizing force when performing the vacuum thermocompression bonding on the stack, or the shape, the hardness or the like of a pressurizing body, it is possible to form electrical connection regions where the electrode 11, 12 and the conductive circuit layer 5, 7 are brought into direct contact with each other and mechanical coupling regions where the electrode 11, 12 and the conductive circuit layer 5, 7 are coupled with each other with the third light transmissive insulator 13 intervened therebetween, on the contact interface between the first electrode 11 or the second electrode 12 and the conductive circuit layer 5, 7 (in particular, the contact interface between the second electrode 12 and the conductive circuit layer 7). By obtaining the contact interface between the electrode 11, 12 and the conductive circuit layer 5, 7 having the structure as described above, it becomes possible to further increase the electrical connection reliability.

The light emitting device 1 of the embodiment uses the light transmissive members for the supports 2, 3 which sandwich the LED chips 8, so that it is suitable for a display device that displays various character strings, geometric figures, patterns, or the like on a door or a window of a building such as a shop, a showroom, or an office, for example, a display device such as a display plate, or a bulletin board, a vehicular lamp such as a brake lamp, or a blinker lamp. FIG. 10 illustrates a door 41 of a building to which the light emitting device 1 of the embodiment is attached, as a usage example of the light emitting device 1 of the embodiment. The door 41 illustrated in FIG. 10 includes a glass plate 43 installed in a door frame 42, and the light emitting device 1 attached to the glass plate 43. The light emitting device 1 has the light transmitting property as a whole, and therefore enables, for example, display as the door (ENTRANCE in FIG. 10) and never loses transparency of the glass plate 43 constituting the door 41. The light emitting device 1 of the embodiment is suitably used for various display devices and lamps required to have transparency.

EXAMPLES

Next, concrete examples and evaluation results thereof will be described.

Example 1

First, a reflective film of distributed Bragg type (DBR film) was formed on a conductive N-type GaAs single crystal substrate through a metal organic vapor phase epitaxy method. Next, an n-AlInGaP cladding layer, an AlInGaP active layer with multiple quantum well structure, and a p-AlInGaP cladding layer were formed, thereby forming a light emitting part with double heterojunction structure. On the light emitting part, a GaAs ohmic contact layer and a buffer layer were formed, and then an ITO transparent electrode film with a thickness of 1.0 μm was formed by a vacuum deposition method. In the manner as described above, the stack of thin films to be the light emitting part was formed on the GaAs single crystal substrate, to thereby produce a red LED epitaxial wafer of three inches (emission wavelength: 630 nm).

Next, a non-light emitting surface of the LED wafer was ground by a diamond die to set a thickness of LED chip to 170 μm, and set a surface roughness Ra of a rear surface (non-light emitting surface) of the LED chip to 2 μm. After forming a photo resist on a light emitting surface of the LED wafer and performing exposure and development, an electrode film with a thickness of 2.0 μm having a gold alloy composition was formed. By peeling the photo resist and an excess electrode film through lift-off processing, a first electrode having a pad shape was formed. A distance H from a surface of the GaAs single crystal substrate to a surface of the first electrode was set to 4.0 μm. On the non-light emitting surface of the LED wafer, an electrode film having a thickness of 1.0 μm and a gold alloy composition same as that of the first electrode, was formed. The electrode film on the non-light emitting surface side was formed on the entire surface of the LED wafer, and this was set to a second electrode. The first and second electrodes were alloyed through vacuum heating.

After forming a photo resist on the light emitting surface of the LED wafer, the photo resist was subjected to exposure and development to set an area of a light emitting layer (an area of the light emitting part) $S_2$ to 0.022 mm². The photo resist was used as a mask to perform dry etching on the stack of thin films to be the light emitting part, thereby forming element isolation trenches defining the area $S_2$ of the light emitting layer to 0.022 mm². The LED wafer was divided into a plurality of LED chips by performing dicing on a center portion of each of the element isolation trenches positioned between adjacent LED chips by a diamond blade to set an area $S_1$ of each of the LED chips separated in pieces to 0.041 mm².

In the manner as described above, the LED chips each having the chip area (the area of the GaAs single crystal substrate) $S_1$ of 0.041 mm², and the area $S_2$ of the light emitting layer of 0.022 mm², were produced. The distance H from the surface of the GaAs single crystal substrate to the surface of the first electrode is 4.0 μm, as described above. A $S_1/S_2$ ratio is 1.864, and a value of $[-(3.46/H)+2.73]$ is 1.865. Therefore, the $S_1/S_2$ ratio is smaller than the value of $[-(3.46/H)+2.73]$. A ratio of the area of the first electrode (pad electrode) to the area $S_2$ of the light emitting layer is about 20%.

Next, polyethylene terephthalate sheets each having a thickness of 180 μm were prepared as first and second light transmissive insulators. On a surface of the polyethylene terephthalate sheet as the first light transmissive insulator, slurry made by dispersing ITO fine particles in an ultraviolet cure acryl-based transparent resin binder was printed to form a conductive circuit layer in which six linearly arranged LED chips were connected in series, thereby producing a first light transmissive support body. Also on a surface of the polyethylene terephthalate sheet as the second light transmissive insulator, a conductive circuit layer was similarly formed to produce a second light transmissive support body. As first and second light transmissive insulating resin sheets, acryl-based elastomer sheets each having a Vicat softening temperature of 110° C., a melting temperature of 220° C., a tensile storage elastic modulus at 0° C. of 1.1 GPa, a tensile storage elastic modulus at 100° C. of 0.3 GPa, a tensile storage elastic modulus at the Vicat softening temperature (110° C.) of 0.2 GPa, a glass transition temperature of −40° C., and a thickness of 60 μm were prepared.

The Vicat softening temperature was determined by using a heat distortion tester No. 148-HD-PC manufactured by Yasuda Seiki Seisakusho, Ltd. under the conditions of a test load of 10 N and a rate of heating of 50° C./hour and under A50 condition described in JIS K7206 (ISO 306). The glass transition temperature and the melting temperature were determined by the method based on JIS K7121 (ISO 3146), by using a differential scanning calorimeter DSC-60 manufactured by Shimadzu Corporation, at a rate of heating of 5° C./minute, by heat flux differential scanning calorimetry. The tensile storage elastic modulus was determined based on JIS K7244-4 (ISO 6721-4), using a dynamic viscoelasticity automatic measuring device DDV-01GP manufactured by A&D Company, Limited, at a rate of uniform heating of 1° C./minute from −100° C. to 200° C., and at a frequency of 10 Hz.

Six pieces of the above-described red light emitting LED chip were prepared. On the conductive circuit layer of the second light transmissive support body, the second light transmissive insulating resin sheet was placed to cover the entire conductive circuit layer and light transmissive insulator, and the six LED chips were disposed at predetermined positions on the second light transmissive insulating resin sheet. The six LED chips were disposed so that their second electrodes were positioned on the second light transmissive insulating resin sheet side, and they were linearly arranged at intervals of 1 mm. On the six LED chips, the first light transmissive insulating resin sheet and the first light transmissive support body were stacked. The first light transmissive insulating resin sheet was disposed so that the conductive circuit layer of the first light transmissive support body was positioned on the first light transmissive insulating resin sheet side. The first light transmissive insulating resin sheet has a shape of covering the entire conductive circuit layer and light transmissive insulator of the first light transmissive support body.

Next, a stack in which the second light transmissive support body, the second light transmissive insulating resin sheet, the LED chips, the first light transmissive insulating resin sheet, and the first light transmissive support body were stacked in order, was preliminarily-pressed at a pressure of 100 kPa, and then a working space was evacuated to 0.1 Pa. The stack was pressed at a pressure of 9.8 MPa while being heated to 120° C. in the vacuum atmosphere as described above. This heating and pressurizing state was kept for 10 minutes, to thereby embed the first and second light transmissive insulating resin sheets in the space between the first light transmissive support body and the second light transmissive support body to form a third light transmissive insulator, while electrically connecting the electrodes of the LED chips and the conductive circuit layers. Thereafter, sealing processing of an end face was conducted by using an ultraviolet cure resin, thereby producing a light emitting device.

In order to confirm a filling structure of the third light transmissive insulator regarding the light emitting device obtained as above, the LED chip and a periphery thereof were observed by SEM. As a result of this, as indicated in FIG. 3, it was confirmed that a part of the third light transmissive insulator was successfully filled between the non-forming surface of the first electrode within the light emitting surface of the LED chip and the conductive circuit layer. Further, it was confirmed that the electrical connection regions where the second electrode and the conductive circuit layer were brought into direct contact with each other and the mechanical coupling regions where a part of the third light transmissive insulator was intervened between the second electrode and the conductive circuit layer, were formed on the contact interface between the second electrode and the conductive circuit layer. Furthermore, a bubble with 0.04 mm² or more and swelling caused by the bubble were not observed in the periphery of the LED chip. Similar results were obtained also in the other examples to be described below. The light emitting device as described above was subjected to later-described characteristic evaluation.

Examples 2 to 14, Comparative Examples 1 to 10

Light emitting devices were produced in a similar manner to the example 1, except that the chip area (the area of the GaAs substrate) $S_1$, the area $S_2$ of the light emitting layer, the distance H from the surface of the semiconductor substrate to the surface of the first electrode, the thickness of the first electrode, the presence/absence or the thickness of the transparent electrode were changed as indicated in Table 1 and Table 2. Note that in the examples 9 to 12, and the comparative examples 7 and 8, polyethylene terephthalate sheets each having a thickness of 180 were prepared as first and second light transmissive insulators, and those obtained by forming ITO thin films with 0.15 μm on surfaces of the polyethylene terephthalate sheets by a vacuum deposition method, and then forming circuits through laser beam machining, were used as first and second light transmissive support bodies. In the examples 13 and 14, and the comparative examples 9 and 10, polyethylene terephthalate sheets each having a thickness of 180 μm were prepared as first and second light transmissive insulators, and those obtained by forming circuits by printing slurry made by dispersing Ag fine particles in a transparent resin binder on surfaces of the polyethylene terephthalate sheets into a mesh shape with an opening of 0.5 mm, were used as first and second light transmissive support bodies. The obtained light emitting devices were subjected to the later-described characteristic evaluation.

Example 15, Comparative Example 11

A red LED epitaxial wafer of three inches (emission wavelength: 630 nm) in which a p-AlInGaP cladding layer, an AlInGaP active layer with multiple quantum well structure, an n-AlInGaP cladding layer, an ohmic contact layer, a buffer layer, and an ITO transparent electrode film with a thickness of 1.0 μm were stacked on a Si substrate via a bonding metal was produced. A light emitting device of the example 15 was produced in a similar manner to the example 1, except that this red LED epitaxial wafer was used. The obtained light emitting device was subjected to the later-described characteristic evaluation. A light emitting device of the comparative example 11 was produced in a similar manner to the example 15 except that the area $S_2$ of the light emitting layer and the thickness of the first electrode were changed.

Example 16, Comparative Example 12

A red LED epitaxial wafer of three inches (emission wavelength: 630 nm) in which a p-AlInGaP cladding layer, an AlInGaP active layer with multiple quantum well structure, an n-AlInGaP cladding layer, an ohmic contact layer, a buffer layer, and an ITO transparent electrode film with a thickness of 1.0 μm were stacked on a SiC substrate via a bonding metal was produced. A light emitting device of the example 16 was produced in a similar manner to the example 1, except that this red LED epitaxial wafer was used.

The obtained light emitting device was subjected to the later-described characteristic evaluation. A light emitting device of the comparative example 12 was produced in a similar manner to the example 16 except that the area $S_2$ of the light emitting layer was changed.

Example 17, Comparative Example 13

A blue LED epitaxial wafer of three inches (emission wavelength: 470 nm) in which an n-GaN: Si layer, an InGaN/GaN active layer with multiple quantum well structure, a p-AlGaN: Mg layer, and a p-GaN: Mg layer were stacked on a SiC substrate was produced. A light emitting device of the example 17 was produced in a similar manner to the example 1, except that this blue LED epitaxial wafer was used. The obtained light emitting device was subjected to the later-described characteristic evaluation. A light emitting device of the comparative example 13 was produced in a similar manner to the example 17 except that the area $S_2$ of the light emitting layer was changed.

TABLE 1

| | Semiconductor Substrate | Semiconductor Layer | Light Emitting Surface | Chip Thickness [μm] | Area S1 of Substrate [mm²] | Area S2 of Light Emitting Layer [mm²] |
|---|---|---|---|---|---|---|
| Example 1 | GaAs | AlGaInP | P Layer | 170 | 0.041 | 0.022 |
| Example 2 | GaAs | AlGaInP | P Layer | 170 | 0.041 | 0.028 |
| Example 3 | GaAs | AlGaInP | P Layer | 170 | 0.041 | 0.034 |
| Example 4 | GaAs | AlGaInP | P Layer | 170 | 0.041 | 0.041 |
| Example 5 | GaAs | AlGaInP | P Layer | 170 | 0.145 | 0.080 |
| Example 6 | GaAs | AlGaInP | P Layer | 170 | 0.145 | 0.100 |
| Example 7 | GaAs | AlGaInP | P Layer | 170 | 0.145 | 0.130 |
| Example 8 | GaAs | AlGaInP | P Layer | 170 | 0.145 | 0.145 |
| Example 9 | GaAs | AlGaInP | P Layer | 170 | 0.041 | 0.022 |
| Example 10 | GaAs | AlGaInP | P Layer | 170 | 0.041 | 0.040 |
| Example 11 | GaAs | AlGaInP | P Layer | 170 | 0.145 | 0.080 |
| Example 12 | GaAs | AlGaInP | P Layer | 170 | 0.145 | 0.140 |
| Example 13 | GaAs | AlGaInP | P Layer | 170 | 0.041 | 0.022 |
| Example 14 | GaAs | AlGaInP | P Layer | 170 | 0.041 | 0.040 |
| Example 15 | Si | AlGaInP | N Layer | 170 | 0.065 | 0.040 |
| Example 16 | Si | InGaN | N Layer | 170 | 0.078 | 0.051 |
| Example 17 | SiC | InGaN | P Layer | 50 | 0.036 | 0.026 |
| Comparative Example 1 | GaAs | AlGaInP | P Layer | 170 | 0.041 | 0.020 |
| Comparative Example 2 | GaAs | AlGaInP | P Layer | 170 | 0.041 | 0.028 |
| Comparative Example 3 | GaAs | AlGaInP | P Layer | 170 | 0.041 | 0.041 |
| Comparative Example 4 | GaAs | AlGaInP | P Layer | 170 | 0.145 | 0.080 |
| Comparative Example 5 | GaAs | AlGaInP | P Layer | 170 | 0.145 | 0.100 |
| Comparative Example 6 | GaAs | AlGaInP | P Layer | 170 | 0.145 | 0.145 |
| Comparative Example 7 | GaAs | AlGaInP | P Layer | 170 | 0.041 | 0.025 |
| Comparative Example 8 | GaAs | AlGaInP | P Layer | 170 | 0.145 | 0.086 |
| Comparative Example 9 | GaAs | AlGaInP | P Layer | 170 | 0.041 | 0.024 |
| Comparative Example 10 | GaAs | AlGaInP | P Layer | 170 | 0.145 | 0.080 |
| Comparative Example 11 | Si | AlGaInP | N Layer | 170 | 0.065 | 0.036 |
| Comparative Example 12 | Si | InGaN | N Layer | 170 | 0.078 | 0.045 |
| Comparative Example 13 | SiC | InGaN | P Layer | 50 | 0.036 | 0.021 |

TABLE 2

| | S1/S2 | Height of Electrode H *1 [μm] | Thickness of First Electrode [μm] | Thickness of Transparent Electrode [μm] | Value based on Height H *2 [μm] | Conductive Circuit Layer |
|---|---|---|---|---|---|---|
| Example 1 | 1.864 | 4.0 | 2.0 | 1.0 | 1.865 | ITO fine particle dispersed layer |
| Example 2 | 1.464 | 3.0 | 1.0 | 1.0 | 1.577 | ITO fine particle dispersed layer |

TABLE 2-continued

|  | S1/S2 | Height of Electrode H *1 [μm] | Thickness of First Electrode [μm] | Thickness of Transparent Electrode [μm] | Value based on Height H *2 [μm] | Conductive Circuit Layer |
|---|---|---|---|---|---|---|
| Example 3 | 1.206 | 3.0 | 1.0 | 1.0 | 1.577 | ITO fine particle dispersed layer |
| Example 4 | 1 | 2.5 | 1.5 | (absence) | 1.346 | ITO fine particle dispersed layer |
| Example 5 | 1.813 | 4.0 | 2.0 | 1.0 | 1.865 | ITO fine particle dispersed layer |
| Example 6 | 1.450 | 3.0 | 1.0 | 1.0 | 1.577 | ITO fine particle dispersed layer |
| Example 7 | 1.115 | 3.0 | 1.0 | 1.0 | 1.577 | ITO fine particle dispersed layer |
| Example 8 | 1 | 3.0 | 1.0 | 1.0 | 1.577 | ITO fine particle dispersed layer |
| Example 9 | 1.864 | 4.0 | 2.0 | 1.0 | 1.865 | ITO vacuum deposited film |
| Example 10 | 1.025 | 2.5 | 1.5 | (absence) | 1.346 | ITO vacuum deposited film |
| Example 11 | 1.813 | 4.0 | 2.0 | 1.0 | 1.865 | ITO vacuum deposited film |
| Example 12 | 1.036 | 2.5 | 0.5 | 1.0 | 1.346 | ITO vacuum deposited film |
| Example 13 | 1.864 | 4.0 | 2.0 | 1.0 | 1.865 | Ag fine particle meshed film |
| Example 14 | 1.025 | 2.5 | 0.5 | 1.0 | 1.346 | Ag fine particle meshed film |
| Example 15 | 1.625 | 4.0 | 2.0 | 1.0 | 1.865 | ITO fine particle dispersed layer |
| Example 16 | 1.529 | 3.0 | 1.0 | 1.0 | 1.577 | ITO fine particle dispersed layer |
| Example 17 | 1.385 | 3.0 | 2.0 | (absence) | 1.577 | ITO fine particle dispersed layer |
| Comparative Example 1 | 2.05 | 4.0 | 2.0 | 1.0 | 1.865 | ITO fine particle dispersed layer |
| Comparative Example 2 | 1.464 | 2.6 | 1.6 | (absence) | 1.399 | ITO fine particle dispersed layer |
| Comparative Example 3 | 1 | 1.8 | 0.4 | 0.4 | 0.808 | ITO fine particle dispersed layer |
| Comparative Example 4 | 1.813 | 3.0 | 1.0 | 1.0 | 1.577 | ITO fine particle dispersed layer |
| Comparative Example 5 | 1.450 | 2.0 | 0.5 | 0.5 | 1 | ITO fine particle dispersed layer |
| Comparative Example 6 | 1 | 1.8 | 0.4 | 0.4 | 0.808 | ITO fine particle dispersed layer |
| Comparative Example 7 | 1.640 | 3.0 | 2.0 | (absence) | 1.577 | ITO vacuum deposited film |
| Comparative Example 8 | 1.686 | 3.0 | 1.0 | 1.0 | 1.577 | ITO vacuum deposited film |
| Comparative Example 9 | 1.708 | 3.0 | 2.0 | (absence) | 1.577 | Ag fine particle meshed film |
| Comparative Example 10 | 1.813 | 3.0 | 1.0 | 1.0 | 1.577 | Ag fine particle meshed film |
| Comparative Example 11 | 1.806 | 3.0 | 1.0 | 1.0 | 1.577 | ITO fine particle dispersed layer |
| Comparative Example 12 | 1.733 | 3.0 | 1.0 | 1.0 | 1.577 | ITO fine particle dispersed layer |
| Comparative Example 13 | 1.714 | 3.0 | 2.0 | (absence) | 1.577 | ITO fine particle dispersed layer |

*1: Distance from surface of semiconductor substrate to surface of first electrode
*2: Value of "−(3.46/H) + 2.73"

Next, the characteristics of the light emitting devices of the examples 1 to 17 and the comparative examples 1 to 13 were evaluated as follows. Eighteen samples were produced for each of examples. For the samples of each of the examples, the bending resistance test described in JIS C5016 (IEC249-1 and IEC326-2) 8.6 was carried out in an energization state under temperature conditions of 20° C.±2° C. and 45° C.±2° C. The samples were bent in a direction perpendicular to an arrangement direction of the LED chips to make the light emitting surfaces locate on the projection side, so that the LED chip row of each of the samples was located on the outside and at the center of the bent portion. In the test under the temperature condition of 20° C.±2° C., six samples were bent at 180° to set a bending radius to 20 mm, and a number of samples in which the lighting state was maintained at that time was examined. In the test under the temperature condition of 45° C.±2° C., six samples were bent at 180° to set a bending radius to 20 mm, six samples were bent at 180° to set a bending radius to 30 mm, and a number of samples in which the lighting state was maintained at that time was examined regarding each of the cases. The bending of each of the samples was carried out by placing the rear surface of the light emitting surface of each of the samples to a cylinder for measurement having a round cross section and a dimeter which corresponds to the above-described bending radius. Each of the tests was carried out by letting the jig and the sample stand for one hour or longer under an environment in which a temperature was 25° C.±2° C. or 45° C.±2° C., relative humidity was 60 to 70%, and an air pressure was 86 to 106 kPa, and after the temperature was stabilized.

TABLE 3

|  | Bending Test at 20° C. | | Bending Test at 45° C. | | | |
|---|---|---|---|---|---|---|
|  | Bending Radius [mm] | Test Result *3 | Bending Radius [mm] | Test Result *3 | Bending Radius [mm] | Test Result *3 |
| Example 1 | 20 | 6/6 | 30 | 6/6 | 20 | 5/6 |
| Example 2 | 20 | 6/6 | 30 | 6/6 | 20 | 6/6 |
| Example 3 | 20 | 6/6 | 30 | 6/6 | 20 | 6/6 |
| Example 4 | 20 | 6/6 | 30 | 6/6 | 20 | 6/6 |
| Example 5 | 20 | 6/6 | 30 | 6/6 | 20 | 5/6 |
| Example 6 | 20 | 6/6 | 30 | 6/6 | 20 | 6/6 |
| Example 7 | 20 | 6/6 | 30 | 6/6 | 20 | 6/6 |
| Example 8 | 20 | 6/6 | 30 | 6/6 | 20 | 6/6 |
| Example 9 | 20 | 6/6 | 30 | 6/6 | 20 | 5/6 |
| Example 10 | 20 | 6/6 | 30 | 6/6 | 20 | 6/6 |
| Example 11 | 20 | 6/6 | 30 | 6/6 | 20 | 5/6 |
| Example 12 | 20 | 6/6 | 30 | 6/6 | 20 | 6/6 |
| Example 13 | 20 | 6/6 | 30 | 6/6 | 20 | 5/6 |

TABLE 3-continued

|  | Bending Test at 20° C. | | Bending Test at 45° C. | | | |
| --- | --- | --- | --- | --- | --- | --- |
|  | Bending Radius [mm] | Test Result *3 | Bending Radius [mm] | Test Result *3 | Bending Radius [mm] | Test Result *3 |
| Example 14 | 20 | 6/6 | 30 | 6/6 | 20 | 6/6 |
| Example 15 | 20 | 6/6 | 30 | 6/6 | 20 | 6/6 |
| Example 16 | 20 | 6/6 | 30 | 6/6 | 20 | 5/6 |
| Example 17 | 20 | 6/6 | 30 | 6/6 | 20 | 6/6 |
| Comparative Example 1 | 20 | 6/6 | 30 | 3/6 | 30 | 0/6 |
| Comparative Example 2 | 20 | 6/6 | 30 | 4/6 | 30 | 2/6 |
| Comparative Example 3 | 20 | 6/6 | 30 | 2/6 | 30 | 0/6 |
| Comparative Example 4 | 20 | 6/6 | 30 | 2/6 | 30 | 0/6 |
| Comparative Example 5 | 20 | 6/6 | 30 | 1/6 | 30 | 0/6 |
| Comparative Example 6 | 20 | 6/6 | 30 | 3/6 | 30 | 0/6 |
| Comparative Example 7 | 20 | 6/6 | 30 | 5/6 | 30 | 3/6 |
| Comparative Example 8 | 20 | 6/6 | 30 | 3/6 | 30 | 1/6 |
| Comparative Example 9 | 20 | 6/6 | 30 | 4/6 | 30 | 1/6 |
| Comparative Example 10 | 20 | 6/6 | 30 | 5/6 | 30 | 2/6 |
| Comparative Example 11 | 20 | 6/6 | 30 | 6/6 | 30 | 3/6 |
| Comparative Example 12 | 20 | 6/6 | 30 | 6/6 | 30 | 3/6 |
| Comparative Example 13 | 20 | 6/6 | 30 | 5/6 | 30 | 2/6 |

*3: Number of samples having maintained lighting state at bending test/number of tested sample As is apparent from Table 3, it was confirmed that in the bending resistance tests at 20° C. and 45° C., each of the light emitting devices of the examples maintained the lighting state even in a state where the bending radius was set to be small. As described above, it can be understood that each of the light emitting devices of the examples is excellent in the flexibility. Specifically, it becomes possible to provide the light emitting device in which the lighting reliability of the LED chips is improved. It was confirmed that the light emitting device of each of the comparative examples maintained the lighting state even if the bending radius was set to be small in the bending resistance test at 20° C., but, in the bending resistance test at 45° C., it could not maintain the lighting state when the bending radius was set to be small, and thus had inferior flexibility.

While certain embodiments of the present invention have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such embodiments or modifications as would fall within the scope and spirit of the inventions.

What is claimed is:

1. A light emitting device, comprising:
a first light transmissive support body including a first light transmissive insulator and a first conductive circuit layer provided on a surface of the first light transmissive insulator;
a second light transmissive support body including a second light transmissive insulator and a second conductive circuit layer provided on a surface of the second light transmissive insulator, the second conductive circuit layer being disposed to face the first conductive circuit layer;
a light emitting diode including a substrate having a first surface and a second surface, a first semiconductor layer of a first conductivity type provided on the first surface of the substrate, a second semiconductor layer of a second conductivity type provided above the first semiconductor layer, a light emitting layer provided between the first semiconductor layer and the second semiconductor layer, a first electrode provided on the second semiconductor layer to have an area smaller than an area of the light emitting layer, and electrically connected to the first conductive circuit layer, and a second electrode provided on the second surface of the substrate, and electrically connected to the second conductive circuit layer, the light emitting diode being disposed between the first light transmissive support body and the second light transmissive support body; and a third light transmissive insulator embedded in a space between the first light transmissive support body and the second light transmissive support body, wherein the light emitting diode has a shape satisfying a relation of $1 \leq S_1/S_2 \leq -(3.46/H)+2.73$, wherein $S_1$ is an area of the first surface of the substrate, $S_2$ is an area of the light emitting layer, and H is a distance from the first surface of the substrate to a surface of the first electrode.

2. The light emitting device of claim 1,
wherein the area $S_2$ is smaller than the area $S_1$.

3. The light emitting device of claim 1,
wherein a ratio of the area $S_1$ to the area $S_2$ ($S_1/S_2$) is 1.2 or more.

4. The light emitting device of claim 1,
wherein a thickness of the third light transmissive insulator is equal to or partially smaller than a height of the light emitting diode.

5. The light emitting device of claim 1,
wherein a plurality of the light emitting diodes are disposed between the first light transmissive support body and the second light transmissive support body; and a minimum thickness $T_2$ of the third light transmissive insulator between the plurality of light emitting diodes is, in a range, smaller than a height $T_1$ of the light emitting diode by 5 μm or more, and smaller than the height $T_1$ by ½ or less of the height $T_1$.

6. The light emitting device of claim 1,
wherein the light emitting layer is provided at a position separated by 1 μm or more from a surface of the second semiconductor layer.

7. The light emitting device of claim 1,
wherein the third light transmissive insulator has a Vicat softening temperature in a range of 80° C. or more and 160° C. or less.

8. The light emitting device of claim 7,
wherein the third light transmissive insulator has a melting temperature of 180° C. or higher, or a melting temperature which is higher by 40° C. or more than the Vicat softening temperature.

9. The light emitting device of claim 1,
wherein the third light transmissive insulator has a tensile storage elastic modulus in a range of 0.01 GPa or more and 10 GPa or less.

10. The light emitting device of claim 1,
wherein the third light transmissive insulator has a glass transition temperature of −20° C. or lower.

11. The light emitting device of claim 1,
wherein each of the first light transmissive support body and the second light transmissive support body has flexibility.

12. The light emitting device of claim 11,
wherein a plurality of the light emitting diodes are disposed between the first light transmissive support body and the second light transmissive support body; and
the first light transmissive support body is curved inward at a position between the light emitting diodes which are adjacent to each other.

13. The light emitting device of claim 12,
wherein the second light transmissive support body is curved inward at the position between the light emitting diodes which are adjacent to each other, from a direction opposite to that of the first light transmissive support body.

14. The light emitting device of claim 1,
wherein a surface of the second semiconductor layer has a forming surface of the first electrode and a non-forming surface of the first electrode, and the third light transmissive insulator is filled between the non-forming surface of the first electrode and the first conductive circuit layer.

15. The light emitting device of claim 1,
wherein a contact interface between the first electrode or the second electrode and the conductive circuit layer has an electrical connection region in which the electrode and the conductive circuit layer are brought into direct contact with each other and a mechanical coupling region in which the electrode and the conductive circuit layer are coupled with each other with the third light transmissive insulator intervened therebetween.

16. The light emitting device of claim 15,
wherein a contact surface of the electrode with the conductive circuit layer has a projecting and recessed shape, and a projection in the projecting and recessed shape is brought into direct contact with the conductive circuit layer to form the electrical connection region, and the third light transmissive insulator is filled in the recess in the projecting and recessed shape to form the mechanical coupling region.

17. The light emitting device of claim 1,
wherein a bubble having an outside diameter of 500 μm or more or a size equal to or greater than an external shape size of the light emitting diode does not exist in the light emitting device.

18. The light emitting device of claim 1,
wherein, when the light emitting device is bent, the first conductive circuit layer is not brought into contact with the substrate based on a relation among the area $S_1$, the area $S_2$, and the distance H.

19. An apparatus comprising the light emitting device of claim 1.

* * * * *